(12) United States Patent
Huang et al.

(10) Patent No.: US 11,086,353 B2
(45) Date of Patent: Aug. 10, 2021

(54) FRACTIONAL CLOCK GENERATOR WITH LOW POWER AND LOW NOISE

(71) Applicant: Shenzhen Goodix Technology Co., Ltd., Guangdong (CN)

(72) Inventors: Yen-Yin Huang, Guangdong (CN); Jung-Yu Chang, Guangdong (CN)

(73) Assignee: Shenzhen Goodix Technology Co., Ltd., Guangdong (CN)

( * ) Notice: Subject to any disclaimer, the term of this patent is extended or adjusted under 35 U.S.C. 154(b) by 105 days.

(21) Appl. No.: 16/158,312

(22) Filed: Oct. 12, 2018

(65) Prior Publication Data

US 2019/0294201 A1 Sep. 26, 2019

Related U.S. Application Data

(63) Continuation of application No. PCT/CN2018/079632, filed on Mar. 20, 2018.

(51) Int. Cl.
  *G06F 1/08* (2006.01)
  *H03B 5/08* (2006.01)
  *H03M 3/00* (2006.01)

(52) U.S. Cl.
  CPC .............. *G06F 1/08* (2013.01); *H03B 5/08* (2013.01); *H03M 3/30* (2013.01)

(58) Field of Classification Search
  None
  See application file for complete search history.

(56) References Cited

U.S. PATENT DOCUMENTS

| | | | |
|---|---|---|---|
| 6,426,662 B1* | 7/2002 | Arcus | H03K 3/0231 327/274 |
| 7,417,510 B2 | 8/2008 | Huang | |
| 7,733,151 B1* | 6/2010 | Yu | G06F 1/08 327/156 |
| 8,791,734 B1* | 7/2014 | Hara | H03L 7/235 327/156 |
| 2010/0066416 A1* | 3/2010 | Ohara | H03L 7/099 327/107 |
| 2011/0006936 A1 | 1/2011 | Lin | |
| 2011/0031906 A1* | 2/2011 | Yasohara | H02P 5/74 318/66 |

(Continued)

FOREIGN PATENT DOCUMENTS

| | | |
|---|---|---|
| CN | 103023495 A | 4/2013 |
| CN | 103117746 A | 5/2013 |

(Continued)

*Primary Examiner* — Danny Chan
(74) *Attorney, Agent, or Firm* — Winston Hsu

(57) ABSTRACT

A clock generator comprise a delta-sigma modulation, DSM, for generating a division control signal and a phase control signal, an oscillator, for generating an oscillation signal with a first frequency, an adjustable frequency divider, for performing a division operation on the oscillation signal according to the division control signal, to generate a first division signal and a second division signal with a second frequency, and a phase interpolator, PI, for performing a phase interpolation operation on the first and second division signals according to the phase control signal, to generate an output signal with an output frequency, wherein the first frequency is greater than the second frequency.

8 Claims, 7 Drawing Sheets

(56) References Cited

U.S. PATENT DOCUMENTS

| | | | |
|---|---|---|---|
| 2011/0285438 A1* | 11/2011 | Kinugasa | H03L 7/087 327/157 |
| 2012/0169387 A1 | 7/2012 | Hara | |
| 2013/0076415 A1 | 3/2013 | Hara | |
| 2014/0055179 A1* | 2/2014 | Gong | H03L 7/081 327/156 |
| 2015/0160687 A1* | 6/2015 | Ciesla | G06F 1/08 713/500 |
| 2018/0107239 A1* | 4/2018 | Anderson | H04L 7/0004 |
| 2018/0356451 A1* | 12/2018 | Zhuang | G01R 25/00 |

FOREIGN PATENT DOCUMENTS

| | | |
|---|---|---|
| CN | 103124175 A | 5/2013 |
| CN | 103780252 A | 5/2014 |
| WO | 2008/039766 A2 | 4/2008 |
| WO | 2008/039766 A3 | 2/2009 |

\* cited by examiner

FRACTIONAL CLOCK GENERATOR WITH LOW POWER AND LOW NOISE

CROSS REFERENCE TO RELATED APPLICATIONS

The present invention is a continuation of international application No. PCT/CN2018/079632, filed on Mar. 20, 2018, of which are incorporated herein by reference in its entirety.

FIELD OF THE INVENTION

The present invention relates to a clock generator, and more particularly, to a fractional-N clock generator capable of lowering power consumption.

BACKGROUND

Electronic system requires signals with different frequencies to accommodate different operations or applications. Based on considerations of design and cost, electronic system usually generates signals of various frequencies based on reference signals.

Generally, the electronic system obtains the required frequency with a phase-locked loop (PLL) if the required signal is a multiple of the reference signal. In addition, if the required signal and the reference signal are in multiples of a fraction, the electronic system can obtain the required frequency with a frequency synthesizer. Referring to FIG. 1, which is a schematic diagram of a PLL 10. The PLL 10 includes the phase-frequency detector (PFD) 100, charge pump (CP) 102, low-pass filter (LPF) 104, voltage-controlled oscillator (VCO) 106 and frequency divider 108. The frequency divider 108 is used for performing a division operation on the output signal CKOUT by integer dividing. PFD 100 is used for receiving the divided output signal CKOUT and reference signal CKIM, and comparing the frequency and phase of the divided output signal CKOUT and reference signal CKIN, to generate a result. The CP 102 is coupled to the PFD 100, and is used for charging or discharging according to the result generated by the PFD 100, to generate signals with different voltages, which pass through the LPF 104 to filter the high frequency noise generated by the PFD 100. After passing through the LPF 104, the VCO 106 is adjusted for generating a corresponding oscillation frequency. With such manner, the output signal CKOUT and reference signal CKIN are in an integer division relationship. Note that, if the noise in the bandwidth of the reference signal CKIN is large, the bandwidth of the PLL 10 can be reduced to suppress the noise, so that bandwidth of a loop filter needs to be reduced to lower the noise, which increases the area of the loop filter. As a result, not only is the production cost of the PLL 10 increased, but the noise of the VCO 106 is also increased due to the bandwidth, which causes that quality of the signal is decreased.

Please refer to FIG. 2, which is a schematic diagram of a frequency synthesizer 20. The frequency synthesizer 20 includes the PFD 200, CP 202, LPF 204, VCO 206, programmable frequency divider 208 and Delta-Sigma Modulation (DSM) 210. Compared to the PLL 10, programmable frequency divider 208 and the DSM 210 of the frequency synthesizer 20 are substituted for the frequency divider 108. Thus, frequency synthesizer 20 utilizes DSM 210 to receive the divided output signal CKOUT, so as to adjust a divisor for the programmable frequency divider 208. With such manner, a mean of the output signal CKOUT generated by the frequency synthesizer 20 and the reference signal CKIN are in fractional division relationship. However, since the DSM 210 of frequency synthesizer 20 generates quantization noise, bandwidth of the loop filter has to be reduced, or resolution of the frequency divider 208 has to be increased, so as to suppress quantization noise. Thus, the circuit area of the loop filter and a number of output phases from the VCO 206 are increased, which increases power consumption.

In a word, neither PLL nor frequency synthesizer can exclude the noise in the bandwidth of the reference signal. In addition, the phase number of the output signal has to be increasing if the system requires high resolution, which increases the manufacturing cost and power consumption of the system. Therefore, it is necessary to improve the conventional technique.

SUMMARY

The present invention is addressed to provide a fractional-division clock generator with low power and lower noise, to solve the abovementioned problems.

The present invention provides a clock generator, which includes a delta-sigma modulation, DSM, for generating a division control signal and a phase control signal, an oscillator, for generating an oscillation signal with a first frequency, an adjustable frequency divider, for performing a division operation on the oscillation signal according to the division control signal, to generate a first division signal and a second division signal with a second frequency, and a phase interpolator, PI, for performing a phase interpolation operation on the first and second division signals according to the phase control signal, to generate an output signal with an output frequency, wherein the first frequency is greater than the second frequency.

In an embodiment, the first frequency is an integer multiple of the second frequency.

In an embodiment, the second division signal is delayed by a cycle than the first division signal, wherein the cycle is an oscillating period of the oscillation signal.

In an embodiment, the output signal is late than the first division signal and the second division signal is late than the output signal.

In an embodiment, the PI comprises a first interpolator module, including a plurality of buffers connected to the first division signal and an interpolated node, a second interpolator module, including a plurality of buffers connected to the second division signal and the interpolated node, and an output buffer, coupled to the interpolated node, for outputting the output signal.

In an embodiment, the DSM further receives a ratio signal for generating the division control signal and the phase control signal.

In an embodiment, the clock generator further comprises a frequency detector, coupled to the PI, for receiving the ratio signal and the reference signal, and comparing the reference signal with a reference frequency to the output signal, to generate a comparison signal, and a low-pass filter, LPF, connected between the frequency detector and the DSM, for filtering high-frequency noise of the comparison signal.

In an embodiment, the DSM receives the filtered comparison signal for generating the division control signal and the phase control signal, to indicate the frequency divider to perform a division operation, the PI to perform a PI operation, so that a ratio of the output frequency to the reference frequency is a fraction.

In an embodiment, the frequency detector comprises a first D-flip flop, including a data input terminal coupled to a system power supply, a frequency input terminal connected to the output signal, a data output terminal for generating a first comparison signal, and a reset terminal, a second D-flip flop, including a data input terminal coupled to the ground, a frequency input terminal connected to the reference signal, a data output terminal for generating a second comparison signal and a reset terminal, a digital circuit, for receiving the ratio signal, the first comparison signal and the second comparison signal, and comparing the output frequency to the reference frequency, to generate the comparison signal, and a NAND gate, including a first data input terminal for receiving the first comparison signal, a second data input terminal for receiving the second comparison signal, and a data output terminal connected between the reset terminal of the first D-flip flop and the reset terminal of the second first D-flip flop.

In an embodiment, the clock generator further comprises a phase-lock loop, PLL, coupled to the PI, for filtering the high-frequency noise of the DSM.

These and other objectives of the present invention will no doubt become obvious to those of ordinary skill in the art after reading the following detailed description of the preferred embodiment that is illustrated in the various figures and drawings.

DETAILED DESCRIPTION

In order to make the objects, technical solutions and advantages of the present invention become more apparent, the following relies on the accompanying drawings and embodiments to describe the present invention in further detail. It should be understood that the specific embodiments described herein are only for explaining the present invention and are not intended to limit the present invention. In addition, the text used for describing the link relationship between two components, such as "coupling" and "connection", should not be used to limit the connection between the two components as a direct connection or an indirect connection.

In an embodiment, the present invention provides a low-noise fractional clock generator. In order to generate a low-noise output signal, the oscillator of the clock generator generates a high-frequency signal with a single frequency and low noise, and the clock generator utilizes the frequency divider to decrease the operating frequency, such that the circuit can perform phase interpolation operation under low frequency, so as to reduce power consumption of the clock generator and increase signal linearity.

Figure 1:
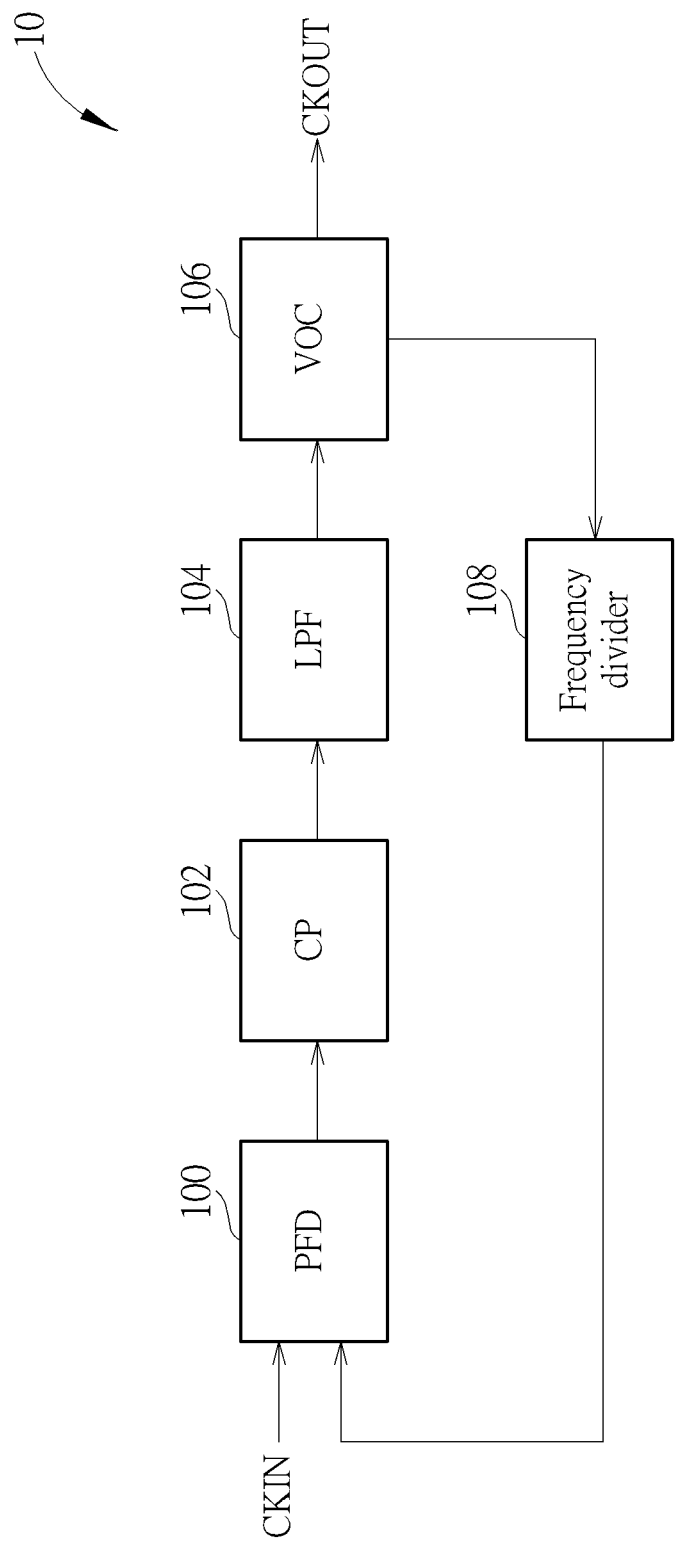
FIG. 1 is a schematic diagram of a phase-locked loop.
Figure 2:
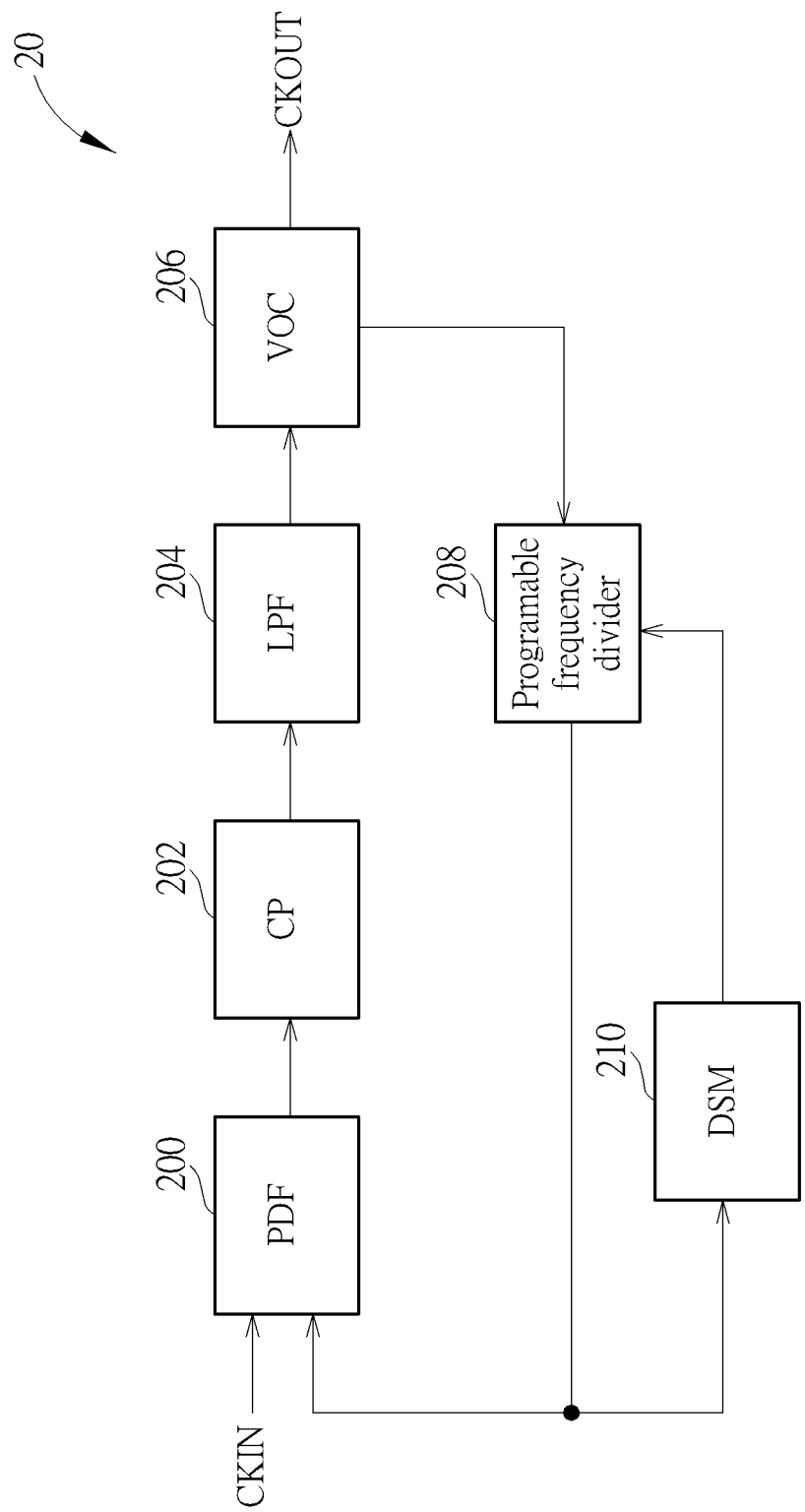
FIG. 2 is a schematic diagram of a frequency synthesizer.
Figure 3:
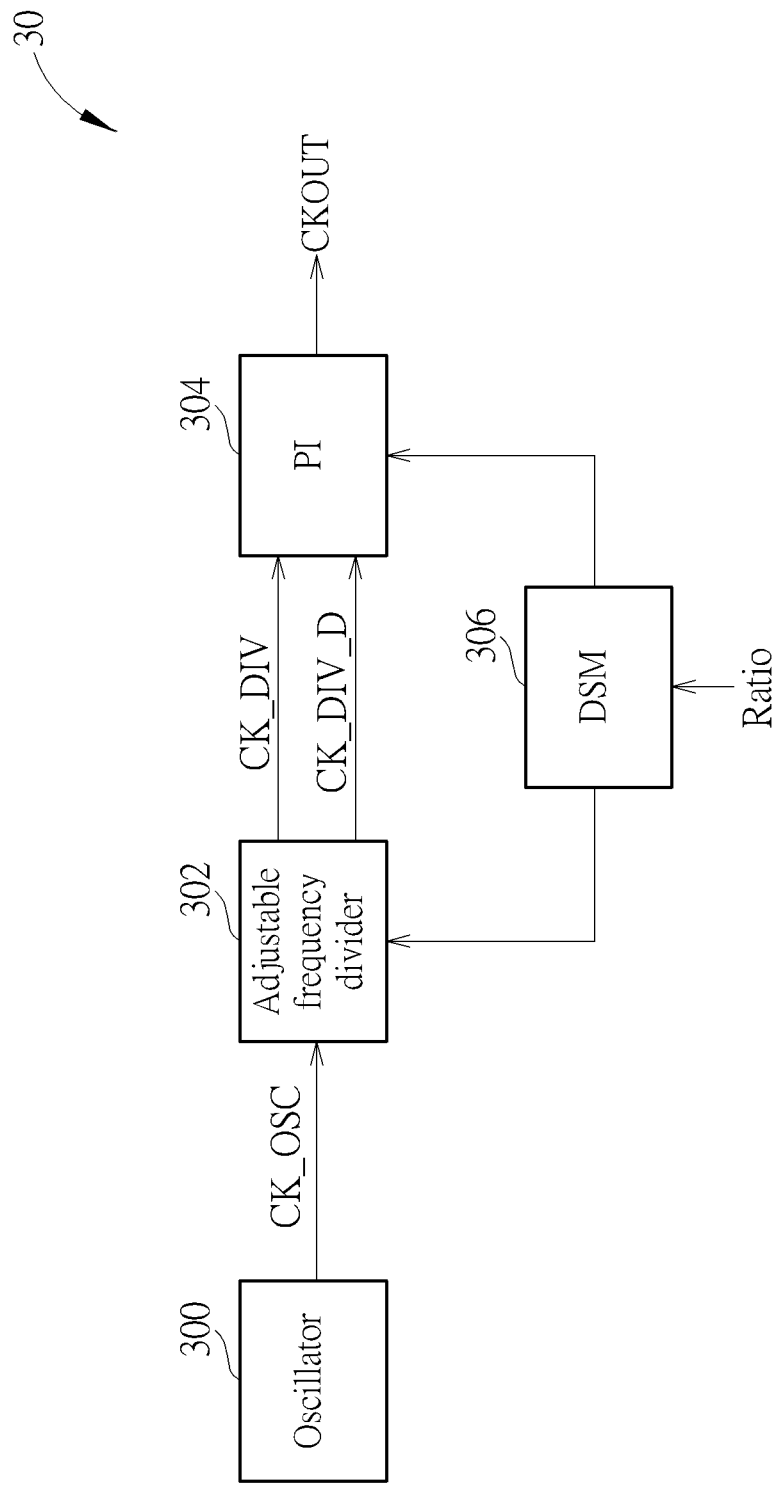
FIG. 3 is a schematic diagram of a clock generator according to an embodiment of the present disclosure.

Reference is made to FIG. 3, which is a schematic diagram of a clock generator 30 according to an embodiment of the present disclosure. The clock generator 30 includes the oscillator 300, the adjustable frequency divider 302, the phase interpolator (PI) 304, and the delta-sigma modulation (DSM) 306. The oscillator 300 generates the oscillation signal CK_OSC with a first frequency. The adjustable frequency divider 302 is coupled to the oscillator 300, and is used for performing the integer division operation on the oscillation signal CK_OSC, to generate the first division signal CK_DIV with a second frequency and the second division signal CK_DIV_D, which is delayed by a cycle than the first division signal CK_DIV. The PI 304 is coupled to the adjustable frequency divider 302, and is used for performing the phase interpolation operation on the first division signal CK_DIV and the second division signal CK_DIV_D, to generate the output signal CKOUT whose phase is allocated between phases of the first division signal CK_DIV and the second division signal CK_DIV_D. DSM 306 is used for receiving a control code to control the adjustable frequency divider 302 and PI 304. In other words, the DSM 306 is capable of generating a division control signal and a phase control signal for adjusting the divisors between the first frequency and the second frequency, so as to adjust the delay between the first division signal CK_DIV and output signal CKOUT.

The oscillator 300 of the present invention generates high-frequency signal with low noise, and performs oscillating on a high-frequency band. The adjustable frequency divider 302 performs division operation with different divisors, and determines a divisor of the division operation according to the indication from the DSM 306, to generate the first division signal CK_DIV on a low-frequency band. In addition, the adjustable frequency divider 302 delays the first division signal CK_DIV by a cycle of the oscillation signal CK_OSC, to generate the second division signal CK_DIV_D. The PI 304 performs the phase interpolation operation on the first division signal CK_DIV and the second division signal CK_DIV_D, and determines a phase of the output signal CKOUT according to an indication from the DSM 306, so as to provide a required delay for the first division signal CK_DIV for adjusting a cycle of the output signal CKOUT, namely adjusting the clock of the output signal CKOUT. Note that, the adjustable frequency divider 302 provides integer frequency divisor, whereas the PI 304 provides fraction frequency divisor, such that the clock generator 30 can utilizes the DSM 306 to indicate the adjustable frequency divider 302 and the PI 304 to perform fractional division operation. In addition, the DSM 306 generates the division control signal and a phase control signal by receiving a ratio signal.

Note that, with structure of the clock generator 30 of the present invention, the clock generator 30 performs division operation by the adjustable frequency divider 302, to lower a frequency of a signal, and then transmits the first division signal CK_DIV to the PI 304 for phase interpolation operation. Thus, under lower operating frequency and longer time of each cycle, the PI 304 can be realized by a simple digital circuit, to reduce power consumption and perform the phase interpolation operation with enough time for generating the output signal CKOUT with better linearity. With such manner, additional driving circuit such as level shifter is not necessary for driving the oscillator 300 to transmit a signal to the PI 304, and thus power consumption of the driving circuit is decreased and the quality of the output signal CKOUT is improved. Moreover, since clock generator 30 of the present invention generates output signal CKOUT with a reference signal, the clock generator 30 utilizes the oscillator 300 to generate a high-frequency signal. In this case, the oscillator 300 is not operated on wide band, so that design complexity for the oscillator 300 is decrease and quality of a signal generated by the oscillator 300 is improved. Finally, the present invention lowers the operating frequency with the adjustable frequency divider 302, and thus the PI 304 of the clock generator 30 can process a signal on low frequency, to lower power consumption. In a word, clock generator 30 of the present invention utilizes the oscillator 300, adjustable frequency divider 302, PI 304 and DSM 306 to generate a low-noise signal path, and lower operating frequency by the adjustable frequency divider 302 for reducing power consumption, so as to achieve fractional clock generator with low power consumption and low noise.

Figure 4:
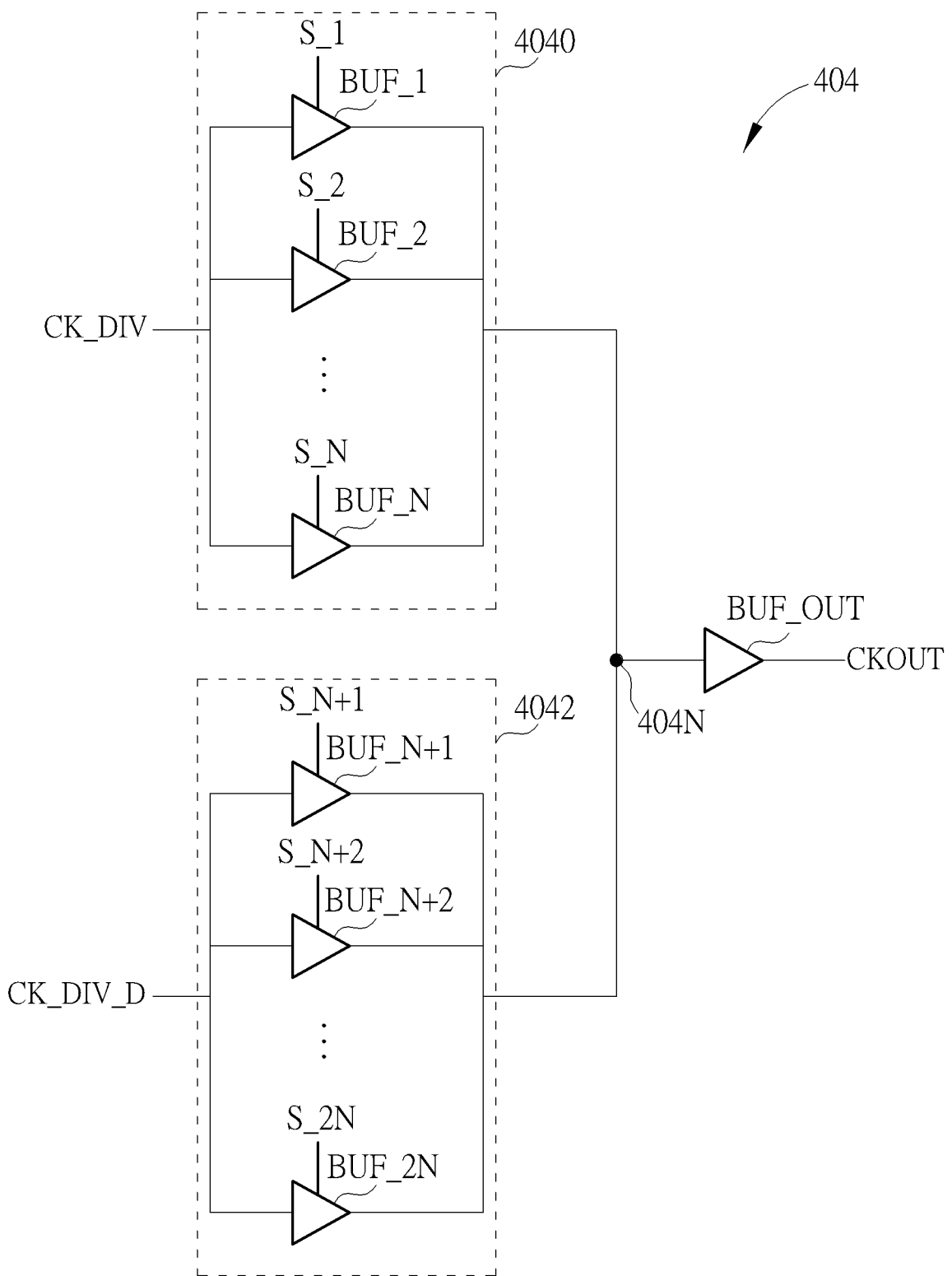
FIG. 4 is a schematic diagram of a phase interpolator according to an embodiment of the present disclosure.

Reference is made to FIG. 4, which is a schematic diagram of a PI 404 according to an embodiment of the present disclosure. The PI 404 includes the interpolator modules 4040 and 4042, and the buffer BUF_OUT. The interpolator module 4040 is connected to the first division signal CK_DIV and the interpolated node, wherein the interpolator module includes the buffers BUF_1-BUF_N parallel connected to the first division signal CK_DIV and the interpolated node 404N. The interpolator module 4042 is connected to the second division signal CK_DIV_D and the interpolated node 404N, wherein the interpolator module 4042 includes a plurality of buffers BUF_N+1-BUF_2N parallel connected to the second division signal CK_DIV_D and interpolated node 404N. The phase on the interpolated node 404N is determined according to phases of the first division signal CK_DIV and the second division signal CK_DIV_D, and the driving ability of the interpolator modules 4040 and 4042, and then the buffer BUF_OUT drives the signal on the interpolated node 404N to generate the output signal CKOUT. In detail, the interpolator module 4040 controls activation or deactivation of the buffers BUF_1-BUF_N according to the interpolated weight signals S_1-S_N. The interpolator module 4042 controls activation or deactivation of the buffers BUF_N+1-BUF_2N according to the interpolated weight signals S_N+1-S_2N. For example, when the interpolated weight signals S_1-S_N indicates one of the buffers BUF_1-BUF_N to be activated, and the interpolated weight signals S_N+1-S_2N indicates a number of N-1 of buffers BUF_N+1-BUF_2N to be activated, a phase weight of the first division signal CK_DIV on the interpolated node 404N is 1/N, and a phase weight of the second division signal CK_DIV_D is N-1/N, and then the buffer BUF_OUT generates the output signal CKOUT. Note that, in this embodiment, the PI 404 has a number of 2N of interpolated weight signals S_1-S_2N, to perform the phase interpolation operation on the first division signal CK_DIV and the second division signal CK_DIV_D.

Note that, in the prior art, in order to increase the resolution of the output signal, oscillator series can be increased or a number of output phases can be increased by interpolating the output of the oscillator, which results in power consumption of the oscillator and additional power consumption for driving signal. Thus, the present invention generates output signal with less number of signal phase of oscillator and lowered operating frequency of the PI, so as to achieve the clock generator with low power consumption.

In an embodiment, clock generator further includes a frequency detector and a LPF, wherein the frequency detector is coupled to the PI, for receiving a ratio signal Ration and comparing the output signal to the reference signal CKIN. The LPF is connected between the frequency detector and the DSM, for filtering the high-frequency noise of frequency detector.

Figure 5:
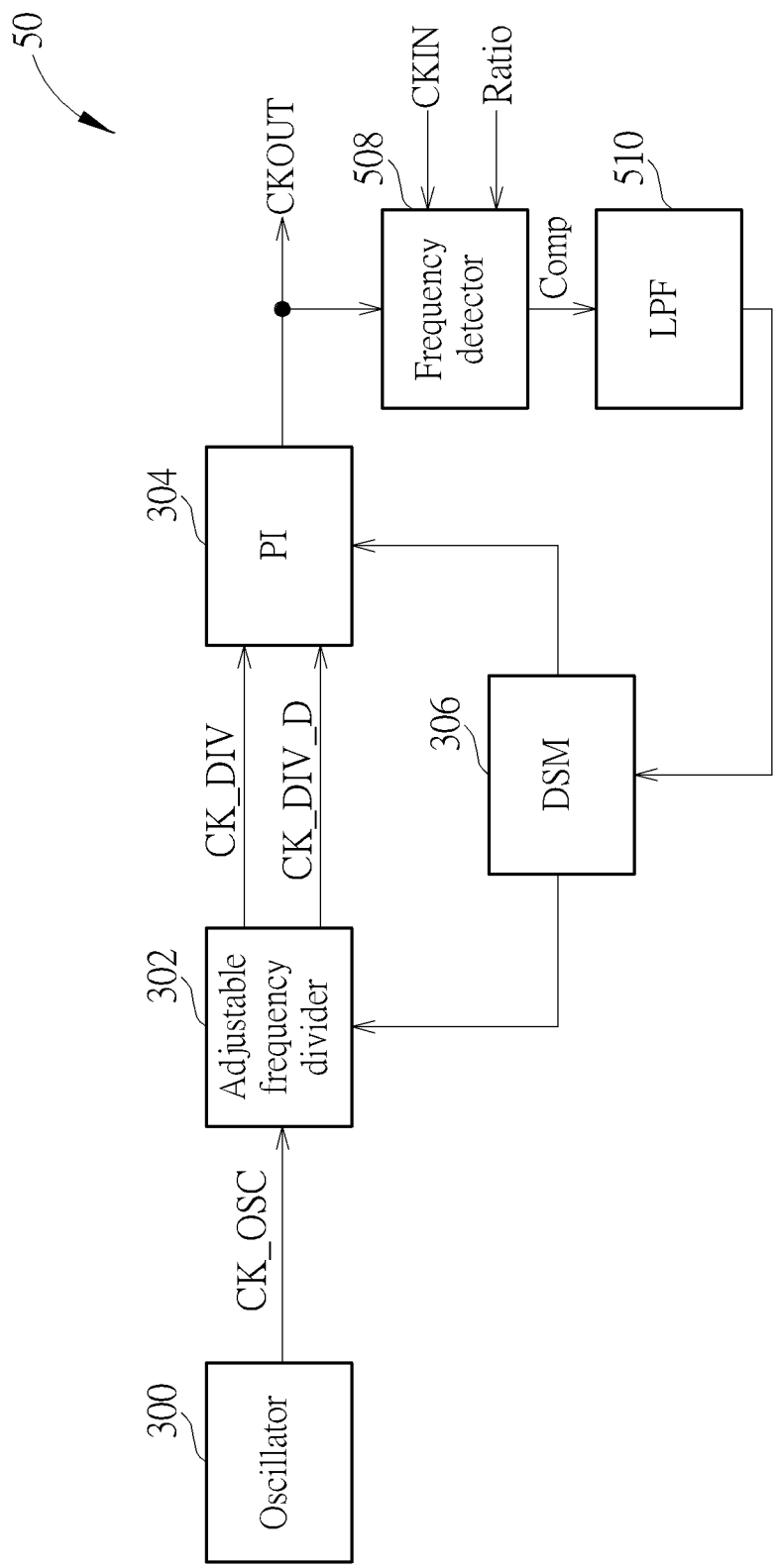
FIG. 5 is a schematic diagram of a clock generator according to an embodiment of the present disclosure.

Reference is made to FIG. 5, which is a schematic diagram of a clock generator 50 according to an embodiment of the present disclosure. The clock generator 50 is derived from the clock generator 30, and therefore the same components are represented by the same symbol. The clock generator 50 includes the oscillator 300, the adjustable frequency divider 302, the PI 304, the DSM 306, the frequency detector 508, and the LPF 510. In FIG. 5, the DSM 306 directly receives the ratio signal to generate the division control signal and the phase control signal. More specifically, the DSM 306 generates the division control signal and the phase control signal according to the indication from the frequency detector 508. The frequency detector 508 is coupled to the PI 304, and is used for receiving the ratio signal Ratio and comparing the output signal to the reference signal CKIN, so as to generate comparison signal Comp for transmitting to the LPF 510. After the LPF 510 filters the high-frequency noise of the comparison signal Comp, the LPF 510 transmit the filtered comparison signal Comp to the DSM 306 for indicating the adjustable frequency divider 302 to adjust a divisor of the division operation and indicating the PI 304 to adjust a phase of the output signal CKOUT. Note that, the frequency detector 508 compares the frequency of the output signal CKOUT to the reference frequency of the reference signal CKIN according to the ratio signal Ratio, so as to determine whether the ratio is conformed to a ratio indicated by the ratio signal Ratio, and then generates a corresponding comparison signal Comp to the DSM 306. Unlike clock generator 30, the clock generator 50 utilizes the frequency detector 508 to compare the reference signal CKIN to the output signal CKOUT, to generate the comparison signal Comp, and transmits the comparison signal Comp to the DSM 306 via the LPF 510, so as to control the adjustable frequency divider 302 and the PI 304. Thus, when an error occurs on the oscillation signal CK_OSC generated by the oscillator 300, the clock generator 50 is able to adjust the division operation via the feedback loop generated by the frequency detector 508 and the LPF 510. In detail, the frequency detector 508 receives the reference signal CKIN to compare the reference signal CKIN to the output signal CKOUT, so as to dynamically adjust a divisor of the division operation of the adjustable frequency divider 302, and adjust the phase interpolation operation of the PI 304, so that the clock generator 50 can generates the output signal CKOUT required by the system. Note that, with the feedback loop of the frequency detector 508 and the LPF 510, a ratio of the frequency of the output signal CKOUT to the frequency of the reference signal CKIN are in fixed fractional relation according to the radio signal Ratio, so as to generate the output signal CKOUT with the average frequency when an error occurs at the oscillator 300. Besides, though the clock generator 50 of the present invention utilizes an external input reference signal CKIN, which may have larger in-band noise, the present invention applies the frequency detector 508 to extract characteristics associated to frequency information of the reference signal CKIN, so as to barrier the noise of the reference signal CKIN on the path of the output signal CKOUT, and thus achieve the fractional clock generator with low power consumption and low noise.

Figure 6:
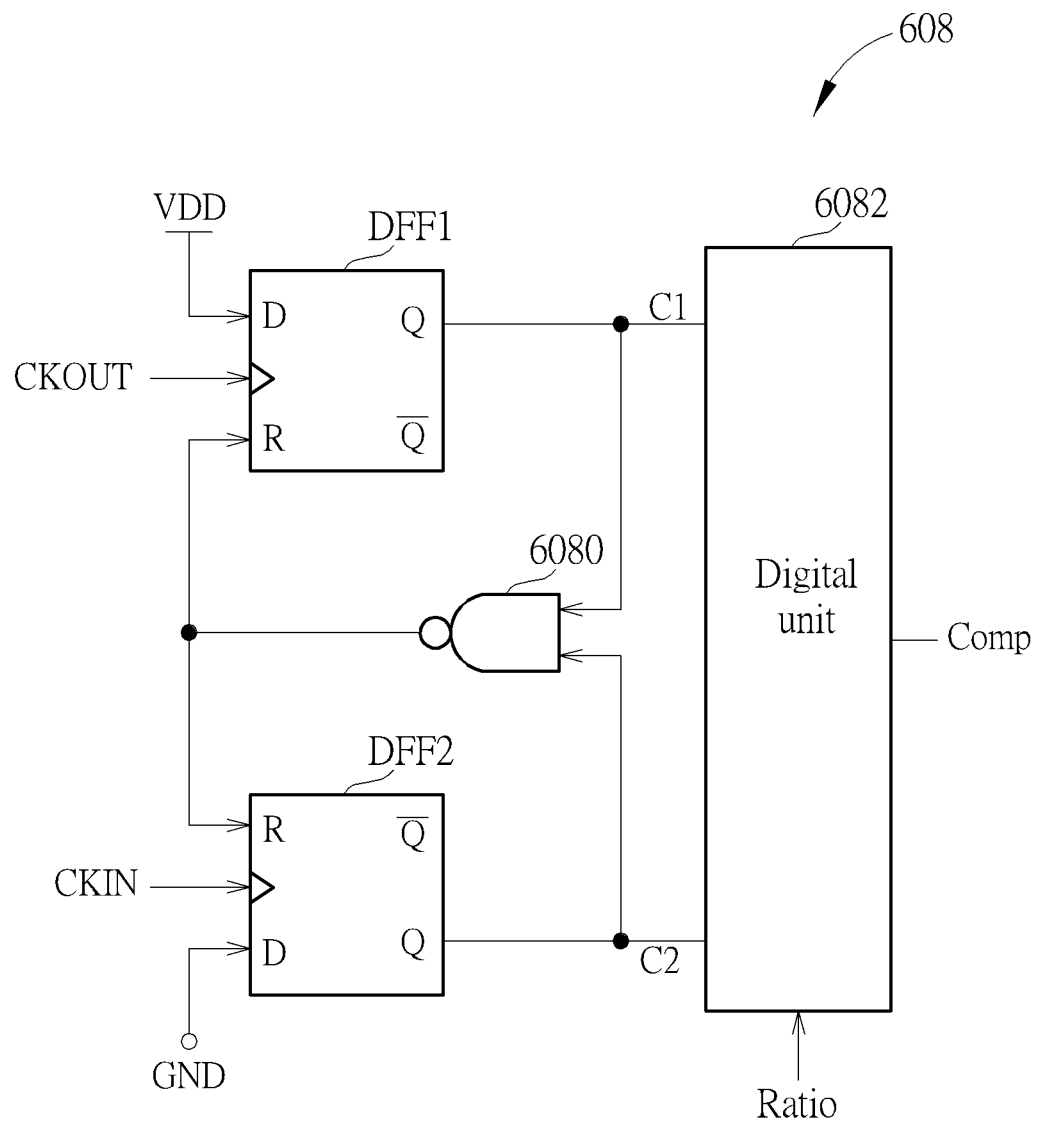
FIG. 6 is a schematic diagram of a frequency detector according to an embodiment of the present disclosure.

Reference is made to FIG. 6, which is a schematic diagram of a frequency detector 608 according to an embodiment of the present disclosure. The frequency detector 608 includes the D Flip-flops DFF1 and DFF2, the NAND gate 6080 and the digital unit 6082. The D Flip-flop DFF1 includes a data input terminal coupled to a system power supply VDD, a frequency input terminal connected to the output signal CKOUT, a data output terminal for generating a comparison signal C1, and a reset terminal. The D Flip-flop DFF2 includes a data input terminal coupled to the ground GND, a frequency input terminal connected to the reference signal CKIN, a data output terminal for generating a second comparison signal C2 and a reset terminal. The NAND gate 6080 is connected between the data output terminals, and the D Flip-flops DFF1 and DFF2, and includes a first data input terminal to receive the first comparison signal C1, a second data input terminal to receive the second comparison signal C2, and a data output terminal coupled to the reset terminal of the D Flip-flops DFF1 and DFF2. The digital unit 6082 is coupled to the D Flip-flops DFF1 and DFF2, and is used for receiving the ratio signal Ratio, so as to compare the first comparison signal C1 to the second comparison signal C2, and determining whether the ratio of the output frequency of the output signal CKOUT to the reference frequency of the reference signal CKIN is conformed to a ratio indicated by the ratio signal Ratio, and then generates the comparison signal Comp. Thus, frequency detector 608 can utilizes D Flip-flops DFF1 and DFF2 to obtain frequency information about comparison between the output signal CKOUT and the reference signal CKIN, and resets the D Flip-flops DFF1 and DFF2 via the NAND gate 6080. The digital unit 6082 generates the comparison signal Comp according to the ratio signal Ratio, to determine the ratio of the frequency of the output signal CKOUT to the frequency of the reference signal CKIN. Noise of the comparison signal Comp generated by the frequency detector 608 is filtered by the LPF 510, and then transmitted to the DSM for adjusting the division control signal and the phase control signal to adjust the division operation of the adjustable frequency divider 302 and the phase interpolation operation of the PI 304.

In an embodiment, the clock generator further includes a Phase-Locked Loop (PLL) coupled to the PI, for filtering quantization noise generated by the DSM.

Figure 7:
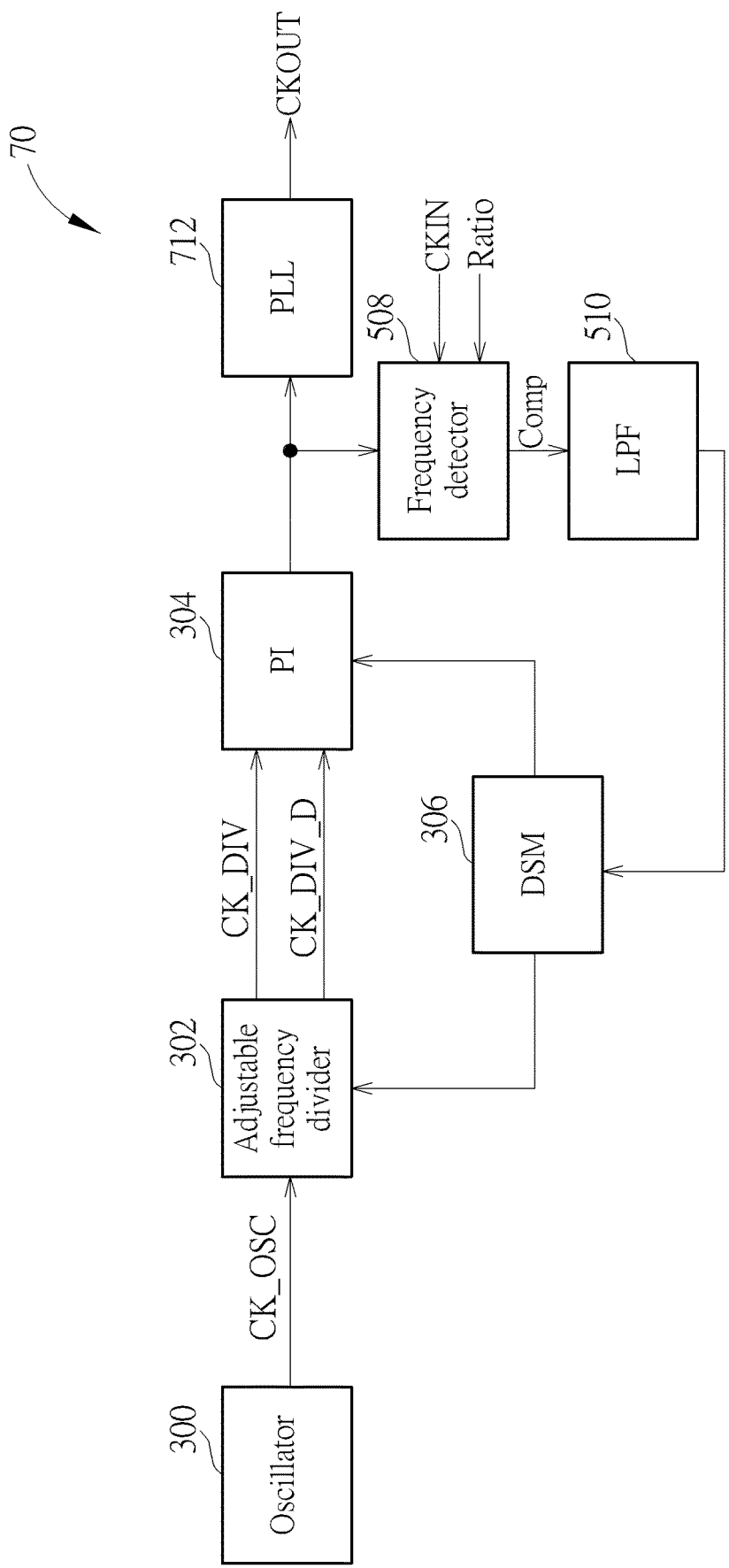
FIG. 7 is a schematic diagram of a clock generator according to an embodiment of the present disclosure.

Reference is made to FIG. 7, which is a schematic diagram of a clock generator 70 according to an embodiment of the present disclosure. The clock generator 70 is derived from the clock generator 50, and therefore the same components are represented by the same symbol. The clock generator 70 includes the oscillator 300, the adjustable frequency divider 302, the PI 304, the DSM 306, the frequency detector 508, the LPF 510, and PLL 712. In FIG. 7, the PLL 712 is coupled to the PI 304, and is used for filtering high-frequency quantization noise generated by the DSM 306, so as to reducing the noise of the output signal CKOUT. In addition, a signal path for the output frequency generated by the oscillator 300 of the clock generator 70 has decreased noise in a path for the reference signal and high-frequency quantization noise generated by the DSM 306. In order to lowering high-frequency quantization noise of the DSM 306, the present invention applies the PLL 712 for filtering quantization noise, to meet the system requirement. Note that, since high-frequency quantization noise has be reduced by the clock generator 70, the PLL 712 only needs to filter high-frequency quantization noise generated by the DSM 306, such that it is not necessary to design a low-bandwidth PLL, which greatly reduces the design complexity, circuit area, and power consumption of the PLL 712.

In the prior art, in order to obtain a good output signal quality, it requires increasing manufacturing cost and power consumption when the input signal and the output signal are in a multiple of a fraction. In comparison, the clock generator of the present invention applies the oscillator to generate high-frequency signal, the adjustable frequency divider to lower the operating frequency, and the PI to adjust output phase, so as to obtain the required output frequency. Thus, the clock generator of the present invention is a fractional clock generator with low power and low noise.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A clock generator comprising:
 a delta-sigma modulation, DSM, for generating a division control signal and a phase control signal;
 an oscillator, for generating an oscillation signal with a first frequency;
 an adjustable frequency divider, for performing a division operation on the oscillation signal according to the division control signal, to generate a first division signal and a second division signal, wherein the first and second division signals have a second frequency;
 a phase interpolator, PI, for performing a phase interpolation operation on the first and second division signals according to the phase control signal, to generate an output signal with an output frequency, wherein the first frequency is greater than the second frequency;
 a frequency detector, coupled to the PI, for receiving a ratio signal and a reference signal, and comparing a frequency of the reference signal to the output signal according to the ratio signal, to generate a comparison signal; and
 a low-pass filter, LPF, connected between the frequency detector and the DSM, for filtering high-frequency noise of the comparison signal;
 wherein the first frequency is an integer multiple of the second frequency.

2. The clock generator of claim 1, wherein the second division signal is generated by delaying the first division signal by a clock cycle, wherein the clock cycle is an oscillating period of the oscillation signal.

3. The clock generator of claim 2, wherein a phase of the output signal is between a phase of the first division signal and a phase of the second division signal.

4. The clock generator of claim 1, wherein the PI comprises:
 a first interpolator module, including a plurality of buffers connected between the first division signal and an interpolated node;
 a second interpolator module, including a plurality of buffers connected between the second division signal and the interpolated node; and
 an output buffer, coupled to the interpolated node, for outputting the output signal.

5. The clock generator of claim 1, wherein the reference signal is in a reference frequency.

6. The clock generator of claim 5, wherein the DSM receives the filtered comparison signal for generating the division control signal and the phase control signal, to indicate the adjustable frequency divider to perform a division operation, the PI to perform a phase interpolation operation, so that a ratio of the output frequency to the reference frequency is a fraction.

7. The clock generator of claim 5, wherein the frequency detector comprises:
 a first D-flip flop, including a data input terminal coupled to a system power supply, a frequency input terminal connected to the output signal, a data output terminal for generating a first comparison signal, and a reset terminal;

a second D-flip flop, including a data input terminal coupled to the ground, a frequency input terminal connected to the reference signal, a data output terminal for generating a second comparison signal and a reset terminal;

a digital circuit, for receiving the ratio signal, the first comparison signal and the second comparison signal, and comparing the output frequency to the reference frequency, to generate the comparison signal; and a NAND gate, including a first data input terminal for receiving the first comparison signal, a second data input terminal for receiving the second comparison signal, and a data output terminal connected between the reset terminal of the first D-flip flop and the reset terminal of the second first D-flip flop.

8. The clock generator of claim 5, further comprising:

a phase-lock loop, PLL, coupled to the PI, for filtering the high-frequency noise of the DSM.

\* \* \* \* \*